United States Patent
Phillips

(12) 
(10) Patent No.: US 6,285,432 B1
(45) Date of Patent: Sep. 4, 2001

(54) METHOD AND APPARATUS FOR LOCATING LCD CONNECTORS

(75) Inventor: John Charles Phillips, New Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/274,213

(22) Filed: Mar. 23, 1999

(51) Int. Cl.[7] .............................. G02F 1/1345; H05K 1/00
(52) U.S. Cl. .............................. 349/149; 439/59; 439/62; 349/151
(58) Field of Search .............................. 349/58, 149, 152, 349/151; 439/660, 59, 62, 79, 680

(56) References Cited

U.S. PATENT DOCUMENTS

| | | | |
|---|---|---|---|
| 3,614,714 | 10/1971 | Silverstein | 339/186 |
| 3,922,051 | * 11/1975 | Reynolds | 339/17 |
| 4,025,147 | * 5/1977 | Van Arsdale et al. | 339/176 |
| 4,737,118 | * 4/1988 | Lockard | 439/289 |
| 5,442,470 | * 8/1995 | Hashimoto | 359/83 |
| 5,528,403 | * 6/1996 | Kawaguchi et al. | 359/88 |
| 5,637,919 | 6/1997 | Grabbe | 257/690 |
| 5,760,862 | * 6/1998 | Bachus | 349/149 |
| 5,854,667 | * 12/1998 | Ackermann | 349/187 |
| 5,906,518 | * 5/1999 | Sun | 439/660 |
| 6,025,901 | * 2/2000 | Adachi et al. | 349/151 |

* cited by examiner

Primary Examiner—William L. Sikes
Assistant Examiner—Dung Nguyen
(74) Attorney, Agent, or Firm—Wood, Phillips, VanSanten, Clark & Mortimer

(57) ABSTRACT

A liquid crystal display (LCD) assembly (200) includes an LCD (100), a registration member (206) attached to the LCD and a connector (202). The connector defines a slot (208) sized to receive the edge (106) of the LCD and a channel (204) positioned to receive the registration member. In one embodiment, the registration member is an inactive electrical component placed on the surface of the LCD solely to provide registration for the connector. The electrical component is very inexpensive and greatly reduces the opportunity for misalignment.

12 Claims, 2 Drawing Sheets

METHOD AND APPARATUS FOR LOCATING LCD CONNECTORS

BACKGROUND OF THE INVENTION

The present invention relates generally to electrical and mechanical connection of electrical components. The present invention more particularly relates to method and apparatus for locating a liquid crystal display connector on a liquid crystal display (LCD).

LCDs are commonly used to provide operational information to users of electronic equipment such as personal computers, personal digital assistants, and cellular telephones. LCDs are manufactured according to well-known processes. An LCD typically is manufactured using a glass plate with an active area on which the information may be displayed. The LCD is contained in a housing of the electronic equipment. The active area is visible through a window defined in the housing.

To increase user convenience, the size of the active area is preferably maximized. One result of this is that the edge of the active area is near the edge of the window. However, when the active area is large, even slight misalignment of the LCD is very apparent to the user.

Many opportunities for LCD misalignment exist. In a typical application, the glass plate of the LCD is retained in a carrier or light guide. The carrier or light guide is fastened to a printed circuit (PC) board. The PC board is mounted in the electrical equipment. Each of these interconnections has a manufacturing tolerance. Misalignment of any of these interconnections can result in misalignment of the active area relative to the window.

Each interconnection of these mechanical components has a nominal alignment and an associated tolerance. The largest manufacturing tolerance is typically the size of the LCD glass plate. Such glass plates are conventionally formed by scrolling and breaking and as a result have a tolerance of ±0.2 mm.

The total tolerance sum for the interconnections is ±1 mm, but the maximum permissible tolerance between the active area and the window is ±0.5 mm. Any misalignment greater than this is visible to the user and will cause rejection of the finished product or require repair before the product can be sold. Those are both expensive steps and are preferably avoided.

Accordingly, there is a need to improve the location of LCD plates in electronic equipment.

DETAILED DESCRIPTION OF THE PRESENTLY PREFERRED EMBODIMENTS

Figure 1:
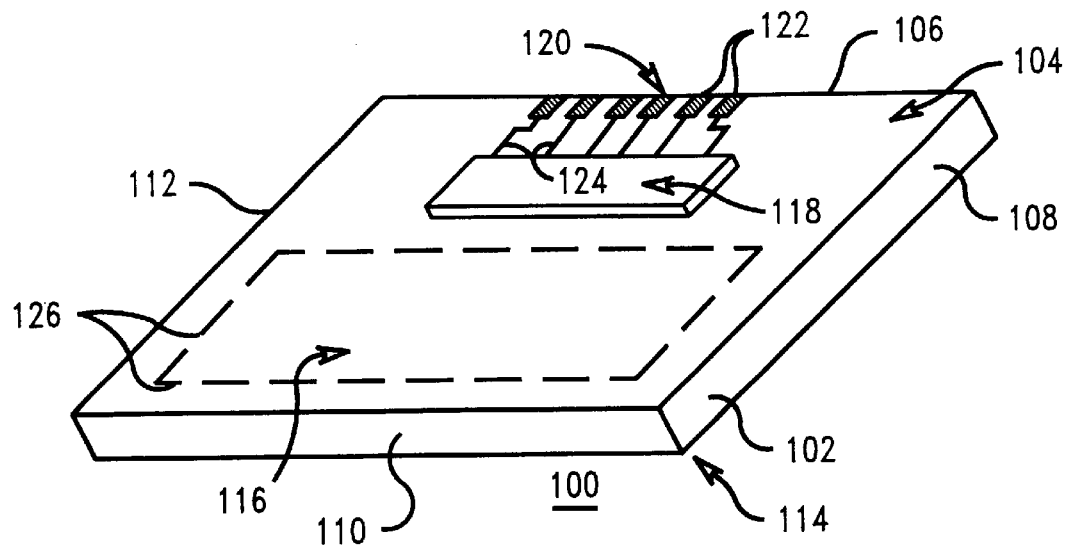
FIG. 1 is a perspective view of a liquid crystal display.
Figure 2:
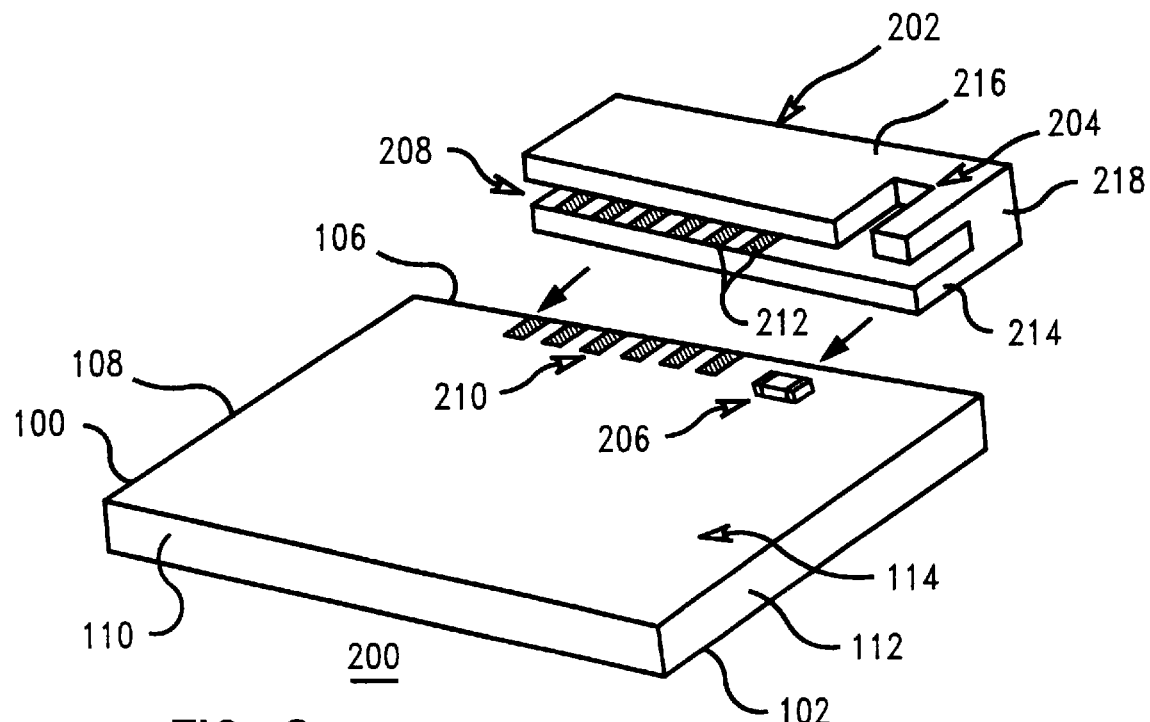
FIG. 2 is an exploded view of a liquid crystal display assembly.
Figure 3:
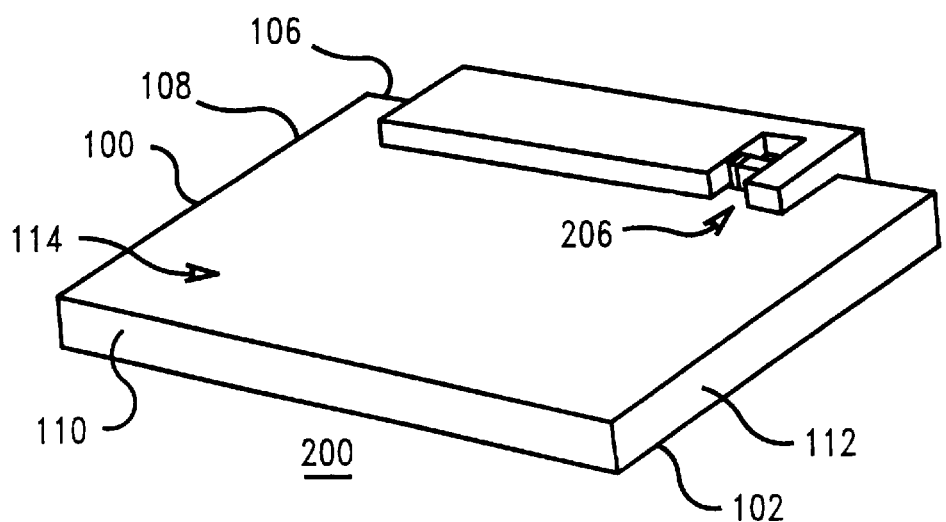
FIG. 3 is a view of a liquid crystal display assembly.

Referring now to the drawings, FIG. 1 shows a perspective view of a liquid crystal display (LCD) 100. The LCD 100 may be manufactured in any suitable fashion. In the illustrated embodiment, the LCD 100 is formed on a glass plate 102 having a top surface 104, an edge 106, an edge 108, an edge 110 and an edge 112. The LCD 100 further has a bottom surface 114 not visible in FIG. 1. The arrangement of the bottom surface 114 is illustrated in FIGS. 2 and 3.

Disposed on the top surface 104 of the glass plate 102 is an active area 116, a driver chip 118 and conductive traces 120. The active area 116 comprises a large number of pixels (picture elements) and has edges 126. The active area 116 is the region on the surface 104 in which visible images are formed by electrical operation of the LCD 100. Such operation is well known in the art. For most LCDs, such as LCD 100, key design goals are maximizing the size of the active area 116 and maximizing the ratio of the active area 116 to the total area of the top surface 104. This is achieved, in part, by minimizing the space between the edges 126 of the active area 116 and the edges 106, 108, 110, 112 of the glass plate 102.

The driver chip 118 is mounted on the top surface 104 of the glass plate 102. Any suitable mounting method may be used, such as a conductive epoxy adhesive. In the illustrated embodiment, however, anisotropic conductive film (ACF) is used for mounting the driver chip 118 to the surface 104. ACF provides advantages of being electrically conductive while resisting delamination. The driver chip 118 is preferably mounted using conventional surface mount assembly equipment. Such equipment is robot controlled and provides very tight placement tolerances. Thus, the driver chip 118 can be placed on the top surface 104 of the glass plate 102 with an accuracy of a few micrometers relative to a nominal position.

The driver chip 118 provides electrical signals to the LCD 100 to cause the LCD 100 to form images in the pixels of the active area 116. Driver chips such as the driver chip 118 are available from a variety of commercial suppliers, as is the LCD 100. Electrical requirements for cooperation of the driver chip 118 with the LCD 100 are well known. In combination, the two form an LCD assembly which is inexpensive, lightweight and adaptable to many different uses.

The conductive traces 120 permit electrical connection to the driver chip 118 from external circuitry (not shown). The conductive traces 120 include conductive fingers 122 and conductive leads 124. The conductive fingers 122 are positioned at the edge 106 of the glass plate 102 and configured for electrical and mechanical engagement by an edge connector, as will be described further in conjunction with FIGS. 2 and 3 below. The lengths, widths and spacing of the conductive fingers 122 are defined according to standard design rules. For proper electrical engagement, the conductor must have electrical leads which are suitably positioned and spaced according to similar design rules.

The conductive leads 124 provide electrical connection between the conductive fingers 122 and electrical contact points on the surface 104 of the glass plate 102 where the driver chip 118 is mounted. Thus, the conductive leads 124 provide electrical connections between the conductive fingers 122 and the driver chip 118.

The conductive fingers 122 and the conductive leads 124 may be formed of any suitable material. In the illustrated embodiment, they are formed of indium tin oxide (ITO). Further, the conductive fingers 122 the conductive leads 124 and the driver chip 118 may be positioned on either side of the LCD 100.

FIG. 2 and FIG. 3 illustrate an LCD assembly 200 including the LCD 100 of FIG. 1. FIG. 1 illustrated the obverse or top surface 104 of the glass plate 102. FIGS. 2 and 3 illustrate the reverse or bottom surface 114 of the glass plate 102.

The LCD assembly 200 as illustrated in FIG. 2 and FIG. 3 includes the LCD 100, an electrical component 206 forming a registration member attached to the LCD 100 proximate the edge 106 of the LCD 100, and a connector 202. The connector defines a slot 208 sized to receive the edge 106 of the LCD 100 and a channel 204 positioned to receive the registration member, electrical component 206.

Disposed on the surface 114 of the glass plate 102 are conductive fingers 210 similar to the conductive fingers 122 disposed on the top surface 104 and illustrated in FIG. 1. Preferably, the conductive fingers 210 are made of ITO, but other suitable materials may be used. The spacing, width and length of the conductive fingers 210 conform to design rules established to ensure reliable electrical contact between the conductive fingers 210 and conductive leads 212 contained within the slot 208 of the connector 202. The width and spacing and length of the leads 212 of the connector 202 similarly match design rules established for reliable contact with the LCD 100.

The connector 202 is preferably fabricated from plastic or other suitable material. In the illustrated embodiment, the connector 202 is U-shaped and has a top portion 214 for engaging the top surface 104 of the LCD 100, a bottom portion 216 for engaging a bottom surface 114 of the LCD 100 and a joining portion 218 joining the top portion 214 and the bottom portion 216. The top portion 214, the bottom portion 216 and the joining portion 218 together define the slot 208 for engaging the edge 106 of the LCD 100. In alternative embodiments, the connector 202 need not be U-shaped and need not be an edge connector. Rather, the connector can have any suitable shape for engaging a portion of the LCD 100.

The conductive leads 212 of the connector 202 are disposed inside the slot 208 for electrically and mechanically contacting the conducting fingers 210, 122 on the LCD 100. The conductive leads 212 are aligned along a top surface and a bottom surface of the slot 208 to match position of conductive fingers on the surfaces of the LCD 100. In alternative embodiments, conductive fingers and leads may be positioned on only one surface of the LCD 100 and the slot 208. In the illustrated embodiment, the connector 202 is assembled with the LCD 100 by sliding the connector 202 onto the edge 106 as indicated by the arrows in FIG. 2. When assembled, the LCD assembly 200 appears as in FIG. 3. In alternative embodiments, the connector 202 may be held in a pocket on the light guide to keep the connector between the LCD 100 and the printed circuit board on which the assembly is mounted.

The electrical component 206 provides tight tolerance control necessary to minimize misalignment between the LCD 100 and the housing of an electronic device such as a radiotelephone including the LCD 100. In one embodiment, the electrical component 206 is an inactive electrical component. In the preferred embodiment, the electrical component 206 comprises an inactive electrical component attached to the surface 114 of the LCD 100 solely to provide registration for the connector 202. In this embodiment, the electrical component 206 may be a component such as a resistor or a capacitor which is placed on the surface 114 of the LCD 100 using standard surface mount assembly techniques. In surface mount assembly, a robot or other machine automatically places the component with a tight tolerance.

Current surface mount equipment can place the electrical component 206 with a tolerance of a few micrometers. This tolerance is a substantial improvement over previous techniques which used the edge of the glass plate 102 to align the connector 202 to the LCD 100, since the tolerance between the active area of the LCD 100 and the edge of the LCD 100 is typically ±0.2 mm. As noted above, this tolerance is the largest among the tolerances that define the positioning of the LCD active area in relation to the window of the housing. By eliminating this large tolerance and replacing it with a tolerance that is measured in micrometers rather than millimeters, the registration of the connector relative to the LCD is reduced.

The electrical component 206 may be mounted to the surface 114 during the same assembly process during which the driver chip 118 is mounted to the surface 104 (FIG. 1). The electrical component 206 may be mounted to the surface 114 using any suitable technique. Examples of suitable techniques include epoxy adhesive, solder paste and ACF.

The electrical component 206 is preferably an inexpensive component, such as a resistor or capacitor. By using an inexpensive, inactive component, the cost of implementing the illustrated technique is minimized. In an alternative embodiment, the electrical component 206 may be an active electrical component, such as the driver chip 118 (FIG. 1). The driver chip 118 is also mounted to the LCD 100 with a very tight tolerance. However, the inventor has determined that the driver chip 118 may not provide the best solution. First, the driver chips from various suppliers have different shapes and sizes, so that a single channel 204 for the connector 202 may not be used. Rather, multiple connectors will have to be stocked for used with different driver chips, which adds to the manufacturing cost of the LCD assembly. Further, mechanically connecting to the driver chip 118 may lead to delamination of the driver chip 118, in which the driver chip 118 is partially dislodged from the surface 104 of the glass plate 102, breaking the electrical connection between the driver chip 118 and the conductive traces 124. An inactive electrical component which is not a part of the electrical circuit including the LCD 100 is not harmed by delamination so long as the component remains at least partially attached. Breaking an electrical connection is not an issue.

In yet a further embodiment, the electrical component 206 may be replaced by any suitable mechanical component or feature located on the surface of the LCD 100. Any sort of nub or grommet, etc., may be used to locate the connector 102. The electrical component 206 provides the advantages of automatic placement at high precision.

In one embodiment, then, a method for locating a LCD connector such as connector 202 on an LCD such as LCD 100 includes a first step of providing a registration member on a surface of the LCD. A second step includes providing an LCD connector having a channel on one portion. Lastly, the assembly is completed by attaching the LDC connector to an edge, such as edge 106, of the LCD so that the channel is positioned to engage the registration member.

The channel 204 is formed in a portion of the connector 202. The dimensions of the channel 204 are suitable to receive the electrical component 206 when the connector 202 slides onto the edge 106 of the LCD 100. The connector 202 can be manufactured to a very tight tolerance. In one example, dimensions of the connector 202 can be controlled to 0.001 inch per inch of length of the connector 202. Accordingly, the channel 204 can be sized to receive the electrical component 206 to a tight tolerance. The channel 204 can be located at any suitable position along the length of the connector 202. In FIGS. 2 and 3, the channel 204 is positioned near one end of the connector 202, away from the conductive fingers 210 on the surface 114 of the LCD and the conductive leads 212 in the slot 208 of the connector 202. In alternative embodiments, the electrical component 206 and the channel 204 may be interspersed with the conducting elements of the LCD assembly 200.

Figure 4:
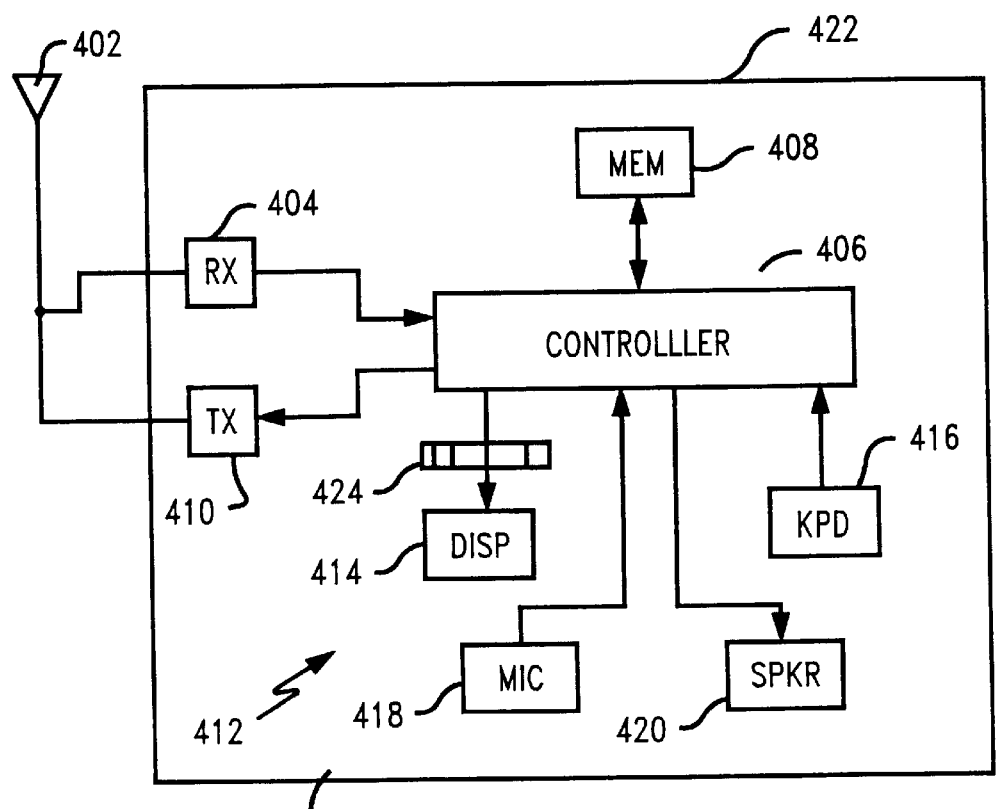
FIG. 4 is a block diagram of a radiotelephone employing the liquid crystal display assembly of FIGS. 2 and 3.

FIG. 4 shows a particular implementation of the LCD assembly 200 illustrated in FIGS. 2 and 3. FIG. 4 is a block diagram of a radiotelephone 400. In the illustrated embodiment, the radiotelephone 400 is a cellular telephone. In alternative embodiments, the radiotelephone 400 may be a personal communication system (PCS) or cordless telephone or any suitable communication device. Of course, the LCD assembly 200 of FIGS. 2 and 3 can be used in a wide range of electronic devices, such as personal digital assistants (PDAs), laptop computers, etc. A radiotelephone such as radiotelephone 400 is just one example of the use of such an LCD assembly 200.

The radiotelephone 400 includes an antenna 402, a receiver 404, controller 406, memory 408, a transmitter 410 and a user interface 412. The user interface 412 includes a liquid crystal display (LCD) 414, a keypad 416, a microphone 418 and a speaker 420. The components of the radiotelephone 400 are contained in a housing 422.

Electromagnetic signals transmitted from a remote location are received at the receiver 404 through the antenna 402 and demodulated and decoded to digital data for use by the controller 406. For transmission, digital data from the controller 406 is conveyed to the transmitter 410 for encoding and modulation of a carrier signal which is impressed upon the antenna 402 for electromagnetic transmission to a remote location. The controller 410 controls operation of the radiotelephone 400 in response to program instructions and data stored in the memory 410.

The user interface 412 allows user control of the radiotelephone 400. Data such as telephone numbers to call and commands may be entered by actuation of keys of the keypad 416. Audio is received at the radiotelephone 400 through the microphone 418 and provided to the user through the speaker 420.

The display 414 is used to communicate operational information to the user of the radiotelephone 400. The display 414 is contained within the housing 422 and preferably incorporates the LCD assembly 200 of FIGS. 2 and 3. To maximize convenience to the user of the radiotelephone 400, the active area of the display 414 is made as large as possible. The size of the active area, which contains the pixels on which data and other information are displayed, depends on a number of factors. One is the overall physical size of the radiotelephone 400. The display 414 is mounted so that the active area is visible through a window in the housing 422. Preferably, and as illustrated in FIGS. 2 and 3, a connector 424 or other mechanical member fixed to the housing 422 defines a channel sized for engagement of a component affixed to the surface of the LCD 414. The component provides registration of the connector 424 relative to the LCD 414. The connector 424 is otherwise positioned relative to the housing 422. Intervening components between the connector 424 and the housing 422 include in one example, a light guide and a printed circuit board. The alignment or misalignment between the active area of the LCD 414 and the housing 422 is the sum of these tolerances. Since the misalignment tolerance of the connector 424 relative to the LCD 414 is small when the channel aligns with the electrical component (FIG. 3), the misalignment between the active area and the housing is greatly reduced.

As can be seen from the foregoing, the present invention provides an improved method and apparatus for locating LCD connectors at the edges of LCDs to form LCD assemblies. An inexpensive, inactive electrical component is mounted on a surface of the LCD using standard surface mount assembly techniques. Such surface mount assembly techniques provide very tight placement tolerances for the electrical component. A connector is subsequently positioned using the electrical component to ensure accurate placement. The combination of the tight placement tolerance for the electrical component and tight positioning tolerance for the connector relative to the electrical component greatly reduces the overall tolerance in manufacturing an electrical device such a radio telephone using an LCD assembly.

While a particular embodiment of the present invention has been shown and described, modifications may be made. For example, any mechanical member fixed to the housing of the radio telephone and defining a channel sized for engagement of the electrical component mounted on the surface of the LCD may be used to locate the LCD relative to the housing. In fact, a portion of the housing, suitably molded, may be used as the mechanical member which engages the component. It is therefore intended in the appended claims to cover all such changes and modifications which follow in the true spirit and scope of the invention.

What is claimed is:

1. A liquid crystal display (LCD) assembly comprising:
   an LCD formed on a glass plate having an active area in which visible images are formed by electrical operation;
   a registration member attached to a surface of the LCD glass plate; and
   a connector defining a slot sized to engage a portion of the LCD lass plate and a channel positioned to received the registration member to minimize misalignment of the active area.

2. The LCD assembly of claim 1 wherein the registration member comprises an electrical component.

3. The LCD assembly of claim 2 wherein the registration member comprises an inactive electrical component.

4. The LCD assembly of claim 3 wherein the registration member comprises an inactive electrical component attached to the surface of the LCD glass plate solely to provide registration for the connector.

5. The LCD assembly of claim 1 further comprising
   the driver chip mounted on the surface of the LCD glass plate; and
   conductive traces formed on the surface for electrically coupling the driver chip and the connector.

6. The LCD assembly of claim 1 wherein the connector has a U-shaped body having a top portion, a bottom and a joining portion defining the slot with an open end on one side of the connector, the open end sized to engage an edge of the LCD glass plate.

7. The LCD assembly of claim 6 wherein the bottom portion defines the channel having an open end on the one side of the connector, the channel being sized to engage the registration member when the connector engages the edge of the LCD glass plate.

8. The LCD assembly of claim 7 wherein the registration member comprises an inactive electrical component attached to the surface of the LCD glass plate.

9. A radio telephone comprising:
   a housing:
   a liquid crystal display (LCD) formed on a glass plate having an active area in which visual images are formed by electrical operation, the glass plate being contained within the housing and including electrical circuitry for producing an image on the LCD active area;

a component affixed to a surface of the LCD glass plate; and a mechanical member fixed to the housing and defining a channel sized for engagement of the component to minimize misalignment between the LCD active area and the housing.

10. The radiotelephone of claim 9 wherein the mechanical member comprises a connector including one or more leads configured for electrical connection with the electrical circuitry.

11. The radio telephone of claim 10 wherein the connector has a top portion for engaging a top surface of the LCD glass plate, a bottom portion for engaging a bottom surface of the LCD glass plate, and a joining portion joining the top portion and the bottom portion, the top portion, the bottom portion and the joining portion defining a slot for engaging an edge of the LCD glass plate.

12. A method for locating a liquid crystal display (LCD) connector on an LCD formed on a glass plate having an active area in which visible images are formed by electrical operation, the method comprising the steps of:

providing a registration member on a surface of the LCD glass plate proximate one or more conductive fingers of the LCD;

providing an LCD connector having a channel on one portion and one or more leads; and attaching the LCD connector to an edge of the LCD glass plate so that the channel is positioned to engage the registration member only when each lead of the one or more leads is properly aligned with a respective finger of the one or more conductive fingers.

* * * * *

UNITED STATES PATENT AND TRADEMARK OFFICE
CERTIFICATE OF CORRECTION

PATENT NO. : 6,285,432 B1
DATED : September 4, 2001
INVENTOR(S) : John Charles Phillips It is certified that error appears in the above-identified patent and that said Letters Patent is hereby corrected as shown below:

Column 6,
Line 34, delete "lass" and insert "glass"

Signed and Sealed this

Twelfth Day of March, 2002

Attest:

Attesting Officer

JAMES E. ROGAN
*Director of the United States Patent and Trademark Office*